US012805069B2

(12) United States Patent
Miyata et al.

(10) Patent No.: US 12,805,069 B2
(45) Date of Patent: Nov. 17, 2026

(54) LIGHT-EMITTING DEVICE, DISPLAY DEVICE, AND ELECTRONIC APPARATUS

(71) Applicant: SEIKO EPSON CORPORATION, Tokyo (JP)

(72) Inventors: Takashi Miyata, Shiojiri (JP); Yoji Kitano, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 448 days.

(21) Appl. No.: 18/597,935

(22) Filed: Mar. 7, 2024

(65) Prior Publication Data

US 2024/0304751 A1 Sep. 12, 2024

(30) Foreign Application Priority Data

Mar. 10, 2023 (JP) ................................ 2023-037684

(51) Int. Cl.
*H10H 20/81* (2025.01)
*H10H 20/825* (2025.01)

(52) U.S. Cl.
CPC ...... *H10H 20/8215* (2025.01); *H10H 20/825* (2025.01)

(58) Field of Classification Search
CPC . H10H 20/8215; H10H 20/825; H10H 20/816
See application file for complete search history.

(56) References Cited

U.S. PATENT DOCUMENTS

2016/0197232 A1 7/2016 Bour et al.
2018/0006190 A1* 1/2018 Obata ................ H10H 20/0137

FOREIGN PATENT DOCUMENTS

JP 2018505567 2/2018

* cited by examiner

*Primary Examiner* — Fernando L Toledo
*Assistant Examiner* — Adam S Bowen
(74) *Attorney, Agent, or Firm* — JCIPRNET

(57) ABSTRACT

Provided is a light-emitting device. A lamination body includes a first semiconductor layer, a second semiconductor layer, a light-emitting layer, and a third semiconductor layer being provided at the second semiconductor layer on a side opposite to the light-emitting layer. Electrical resistivity of the second semiconductor layer is higher than electrical resistivity of the third semiconductor layer. A first electrode is electrically coupled to the first semiconductor layer. A second electrode is electrically coupled to the third semiconductor layer. The lamination body includes a first portion and a second portion being in contact with the first portion. In the first portion, the first semiconductor layer, the light-emitting layer, the second semiconductor layer, and the third semiconductor layer overlap with each other. In the second portion, the first semiconductor layer, the light-emitting layer, and the second semiconductor layer overlap with each other, and the third semiconductor layer does not overlap therewith.

11 Claims, 7 Drawing Sheets

LIGHT-EMITTING DEVICE, DISPLAY DEVICE, AND ELECTRONIC APPARATUS

The present application is based on, and claims priority from JP Application Serial Number 2023-037684, filed Mar. 10, 2023, the disclosure of which is hereby incorporated by reference herein in its entirety.

BACKGROUND

1. Technical Field

The present disclosure relates to a light-emitting device, a display device, and an electronic apparatus.

2. Related Art

A light-emitting device such as a light-emitting diode (LED) is applied to a light source of a display device or the like.

For example, JP-A-2018-505567 describes a light-emitting diode including a p-n diode layer including an upper current diffusion layer, a lower current diffusion layer, an active layer between the upper current diffusion layer and the lower current diffusion layer, and a p-n diode layer side wall extending across the upper current diffusion layer, the active layer, and the lower current diffusion layer.

In the light-emitting diode described above, it has been desired to reduce non-light-emission recombination on the side wall.

SUMMARY

A light-emitting device according to one aspect of the present disclosure includes a lamination body, and a first electrode and a second electrode, wherein the lamination body includes a first semiconductor layer having a first conductivity type, a second semiconductor layer having a second conductivity type different from the first conductivity type, a light-emitting layer being provided between the first semiconductor layer and the second semiconductor layer, and a third semiconductor layer being provided on an opposite side of the second semiconductor layer from the light-emitting layer and having the second conductivity type, electrical resistivity of the second semiconductor layer is higher than electrical resistivity of the third semiconductor layer, the first electrode is electrically coupled to the first semiconductor layer, the second electrode is electrically coupled to the third semiconductor layer, the lamination body includes a first portion and a second portion being in contact with the first portion as viewed in a lamination direction of the first semiconductor layer and the light-emitting layer, in the first portion, the first semiconductor layer, the light-emitting layer, the second semiconductor layer, and the third semiconductor layer overlap with each other, and, in the second portion, the first semiconductor layer, the light-emitting layer, and the second semiconductor layer overlap with each other, and the third semiconductor layer does not overlap therewith.

A display device according to one aspect of the present disclosure includes the light-emitting device according to the aspect.

An electronic apparatus according to one aspect of the present disclosure includes the light-emitting device according to the aspect.

DESCRIPTION OF EMBODIMENTS

A preferred embodiment of the present disclosure is described below in detail with reference to the drawings. Note that the embodiment described below does not unduly limit the content of the present disclosure described in the claims. In addition, not all the configurations described below are essential constituent elements of the present disclosure.

1. Light-Emitting Device

1.1. Overall Configuration

Figure 1:
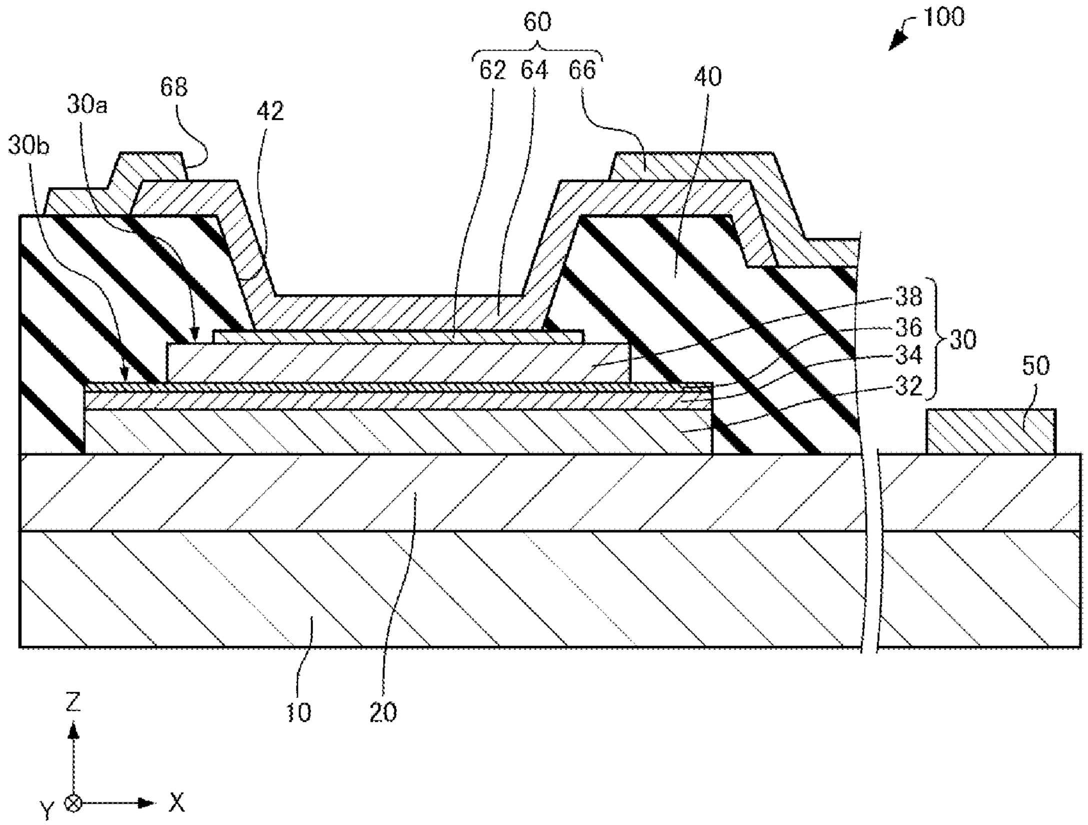
FIG. 1 is a cross-sectional view schematically illustrating a light-emitting device according to an embodiment.

First, a light-emitting device according to the present embodiment is described with reference to the drawings. FIG. 1 is a cross-sectional view schematically illustrating a light-emitting device 100 according to the present embodiment. Note that, in FIG. 1, an X axis, a Y axis, and a Z axis are illustrated as three axes orthogonal to one another.

As illustrated in FIG. 1, for example, the light-emitting device 100 includes a substrate 10, a buffer layer 20, a lamination body 30, an insulating layer 40, a first electrode 50, and a second electrode 60. The light-emitting device 100 is an LED, for example.

The substrate 10 is a silicon substrate, a GaN substrate, a sapphire substrate, or a SiC substrate, for example.

The buffer layer 20 is provided at the substrate 10. The buffer layer 20 is provided between the substrate 10 and the lamination body 30. The buffer layer 20 has a first conductivity type. The buffer layer 20 is an n-type GaN layer doped with Si, for example.

Note that, in the present specification, description is given with a lamination direction of a first semiconductor layer 32 and a light-emitting layer 34 of the lamination body 30

(hereinafter, simply referred to as a "lamination direction") with the light-emitting layer 34 as a reference. Specifically, a direction from the light-emitting layer 34 to a second semiconductor layer 36 of the lamination body 30 is defined as "upward", and a direction from the light-emitting layer 34 to the first semiconductor layer 32 is defined as "downward". In the illustrated example, the lamination direction is the Z-axis direction. In addition, a direction orthogonal to the lamination direction is also referred to as an "in-plane direction".

The lamination body 30 is provided at the buffer layer 20. The lamination body 30 is provided between the buffer layer 20 and the second electrode 60. The lamination body 30 includes the first semiconductor layer 32, the light-emitting layer 34, the second semiconductor layer 36, and a third semiconductor layer 38. The first semiconductor layer 32, the light-emitting layer 34, the second semiconductor layer 36, and the third semiconductor layer 38 are, for example, a group III nitride semiconductor, and have a wurtzite crystal structure.

The first semiconductor layer 32 is provided at the buffer layer 20. The first semiconductor layer 32 is provided between the buffer layer 20 and the light-emitting layer 34. The first semiconductor layer 32 has the first conductivity type. The first semiconductor layer 32 is an n-type GaN layer doped with Si, for example.

The light-emitting layer 34 is provided at the first semiconductor layer 32. The light-emitting layer 34 is provided between the first semiconductor layer 32 and the second semiconductor layer 36. The light-emitting layer 34 has a conductivity type being an i-type, which is not doped with impurities intentionally. The light-emitting layer 34 generates light when a current is injected thereinto. The light-emitting layer 34 includes, for example, a well layer and a barrier layer. The well layer and the barrier layer are i-type semiconductor layers. The well layer is an InGaN layer, for example. The barrier layer is a GaN layer, for example. The light-emitting layer 34 has a multiple quantum well (MQW) structure formed of the well layer and the barrier layer.

Note that the numbers of the well layers and the barrier layers forming the light-emitting layer 34 are not particularly limited. For example, only one well layer may be provided, and in this case, the light-emitting layer 34 has a single quantum well (SQW) structure.

The second semiconductor layer 36 is provided at the light-emitting layer 34. The second semiconductor layer 36 is provided between the light-emitting layer 34 and the third semiconductor layer 38. The second semiconductor layer 36 has a second conductivity type different from the first conductivity type. The second semiconductor layer 36 is a p-type AlGaN layer doped with Mg, for example. Note that the second semiconductor layer 36 may be a p-type GaN layer, for example.

The electrical resistivity of the second semiconductor layer 36 is higher than the electrical resistivity of the third semiconductor layer 38. The electrical resistivity is measured by four-terminal sensing, for example. For example, an impurity concentration of the second semiconductor layer 36 is lower than an impurity concentration of the third semiconductor layer 38. Note that, when the second semiconductor layer 36 is an AlGaN layer, and the third semiconductor layer 38 is a Gan layer, the impurity concentration of the second semiconductor layer 36 and the impurity concentration of the third semiconductor layer 38 may be the same. The impurity concentrations are measured by, for example, an atom probe analysis.

The third semiconductor layer 38 is provided at the second semiconductor layer 36. The third semiconductor layer 38 is provided between the second semiconductor layer 36 and the second electrode 60. The third semiconductor layer 38 is provided on an opposite side of the second semiconductor layer 36 from the light-emitting layer 34. The third semiconductor layer 38 has the second conductivity type. The third semiconductor layer 38 is a p-type GaN layer doped with Mg, for example.

In the light-emitting device 100, a pin diode is configured by the p-type third semiconductor layer 38, the p-type second semiconductor layer 36, the i-type light-emitting layer 34, and the n-type first semiconductor layer 32. In the light-emitting device 100, when a forward bias voltage of the pin diode is applied between the first electrode 50 and the second electrode 60, a current is injected into the light-emitting layer 34, and electrons and positive holes are recombined in the light-emitting layer 34. This recombination causes the light-emitting layer 34 to emit light.

Note that, although not illustrated, a reflective layer may be provided between the substrate 10 and the buffer layer 20 or below the substrate 10. The reflective layer is a Distributed Bragg Reflector (DBR) layer, for example. The reflective layer can reflect the light generated in the light-emitting layer 34, to the second electrode 60 side.

The insulating layer 40 covers the lamination body 30. The insulating layer 40 is provided at the top surface of the buffer layer 20, the side surface of the lamination body 30, and the top surface of the lamination body 30. The insulating layer 40 is a silicon oxide layer, a silicon nitride layer, or a polyimide layer, for example. A contact hole 42 is formed in the insulating layer 40. The contact hole 42 overlaps with a first conductive layer 62 of the second electrode 60, as viewed in the lamination direction.

The first electrode 50 is provided at the buffer layer 20. The buffer layer 20 may be in ohmic contact with the first electrode 50. The first electrode 50 is electrically coupled to the first semiconductor layer 32 via the buffer layer 20. As the first electrode 50, one formed by, for example, stacking a Cr layer, a Ni layer, and an Au layer in this order from the buffer layer 20 side or the like is used. The first electrode 50 is one electrode configured to inject a current into the light-emitting layer 34.

The second electrode 60 is provided at the lamination body 30. The second electrode 60 is electrically coupled to the third semiconductor layer 38. The second electrode 60 is the other electrode configured to inject a current into the light-emitting layer 34.

For example, the second electrode 60 includes the first conductive layer 62, a second conductive layer 64, and a third conductive layer 66.

The first conductive layer 62 is provided at the third semiconductor layer 38. The first conductive layer 62 is provided between the third semiconductor layer 38 and the second conductive layer 64. The third semiconductor layer 38 may be in ohmic contact with the first conductive layer 62. The first conductive layer 62 defines the bottom surface of the contact hole 42. The thickness of the first conductive layer 62 is smaller than the thickness of the second conductive layer 64. The first conductive layer 62 transmit the light generated in the light-emitting layer 34. The first conductive layer 62 has such a thickness that the light generated in the light-emitting layer 34 is transmitted therethrough. The first conductive layer 62 is a layer formed by, for example, stacking a Pd layer, a Pt layer, a Ni layer, and an Au layer in this order from the third semiconductor layer 38 side, or a single metal layer. The electrical resistivity of the first conductive layer 62 is lower than the electrical resistivity of the second conductive layer 64. The first conductive layer 62 can reduce contact resistance between the second electrode 60 and the third semiconductor layer 38. In plan view from the lamination direction, an area of a region in which the first conductive layer 62 is arranged is smaller than an area of a region in which the third semiconductor layer 38 is arranged. Further, in plan view from the lamination direction, the region in which the first conductive layer 62 is arranged is positioned on the inner side of the region in which the third semiconductor layer 38 is arranged. In other words, in plan view from the lamination direction, the entire region in which the first conductive layer 62 is arranged is positioned on the inner side of the outer edge of the region in which the third semiconductor layer 38 is arranged.

The second conductive layer 64 is provided at the first conductive layer 62. The second conductive layer 64 is provided to the contact hole 42. In the illustrated example, further, the second conductive layer 64 is provided at the insulating layer 40. The second conductive layer 64 transmit the light generated in the light-emitting layer 34. For example, the material of the second conductive layer 64 is Indium Tin Oxide (ITO), AZO obtained by doping zinc oxide (ZnO) with aluminum (Al), or GZO obtained by doping ZnO with gallium (Ga).

The third conductive layer 66 is provided at the second conductive layer 64 and the insulating layer 40. The third conductive layer 66 is a layer formed by stacking a Cr layer and an Au layer in this order from the second conductive layer 64 side. An opening 68 is formed in the third conductive layer 66. The opening 68 overlaps with the contact hole 42 as viewed in the lamination direction.

While the light-emitting layer 34 described above is InGaN based, the light-emitting layer 34 may be made of various materials capable of emitting light when a current is injected thereinto, depending on the wavelength of light to be emitted. For example, semiconductor materials that are AlGaN based, AlGaAs based, InGaAs based, InGaAsP based, InP based, GaP based, AlGaP based, and the like may be used.

Further, in the description given above, the first conductivity type is an n-type, and the second conductivity type is a p-type. Alternatively, the first conductivity type may be a p-type, and the second conductivity type may be an n-type.

Further, although not illustrated, the lamination body 30 may include a plurality of nanostructures.

Further, the light-emitting device 100 may be a semiconductor laser.

1.2. Layered Body

Figure 2:
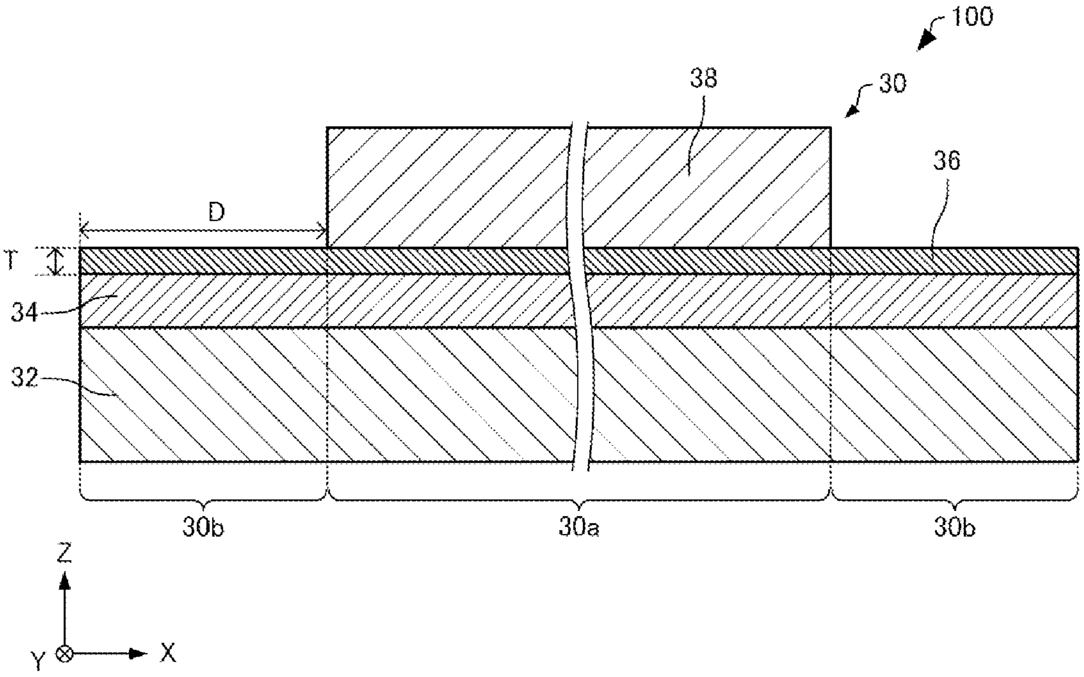
FIG. 2 is a cross-sectional view schematically illustrating a lamination body of the light-emitting device according to the present embodiment.
Figure 3:
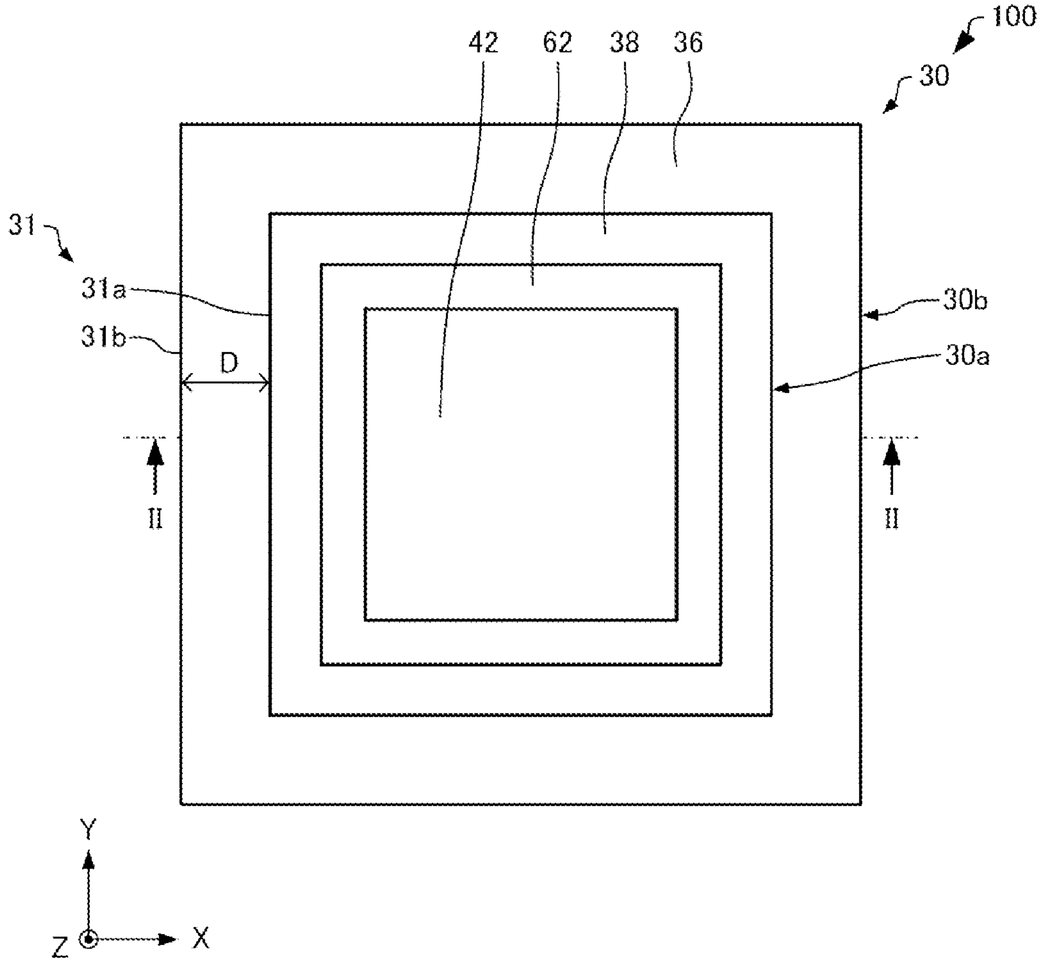
FIG. 3 is a plan view schematically illustrating the light-emitting device according to the present embodiment.

FIG. 2 is a cross-sectional view schematically illustrating the lamination body 30 of the light-emitting device 100. FIG. 3 is a plan view schematically illustrating the light-emitting device 100. Note that FIG. 2 is a cross-sectional view taken along the line II-II in FIG. 3. Further, for the sake of convenience, in FIG. 3, illustration of members other than the lamination body 30, the contact hole 42, and the first conductive layer 62 is omitted.

As illustrated in FIG. 2 and FIG. 3, the lamination body 30 includes a first portion 30*a* and a second portion 30*b*.

In the first portion 30*a*, as viewed in the lamination direction, the first semiconductor layer 32, the light-emitting layer 34, the second semiconductor layer 36, and the third semiconductor layer 38 overlap with each other. The first portion 30*a* is formed of the first semiconductor layer 32, the light-emitting layer 34, the second semiconductor layer 36, and the third semiconductor layer 38. The first portion 30*a* forms the side surface of the third semiconductor layer 38. In the example illustrated in FIG. 3, the shape of the first portion 30*a* in plan view is square. The shape of the third semiconductor layer 38 in plan view is the same as the shape of the first portion 30*a* in plan view. As viewed in the lamination direction, the size of the third semiconductor layer 38 is the same as the size of the first portion 30*a*.

In the second portion 30*b*, as viewed in the lamination direction, the first semiconductor layer 32, the light-emitting layer 34, and the second semiconductor layer 36 overlap with each other, and the third semiconductor layer 38 does not overlap therewith. The second portion 30*b* is formed of the first semiconductor layer 32, the light-emitting layer 34, and the second semiconductor layer 36. The third semiconductor layer 38 does not form the second portion 30*b*. The second portion 30*b* forms the side surface of the first semiconductor layer 32, the side surface of the light-emitting layer 34, and the side surface of the second semiconductor layer 36. In the example illustrated in FIG. 3, the shape of the second semiconductor layer 36 in plan view is square. The shape of the first semiconductor layer 32 in plan view, the shape of the light-emitting layer 34 in plan view, and the shape of the second semiconductor layer 36 in plan view are the same, for example. As viewed in the lamination direction, the size of the first semiconductor layer 32, the size of the light-emitting layer 34, and the size of the second semiconductor layer 36 are the same, for example.

The second portion 30*b* is in contact with the first portion 30*a*. As illustrated in FIG. 3, as viewed in the lamination direction, the second portion 30*b* extends from the first portion 30*a*. As viewed in the lamination direction, the second portion 30*b* surrounds the first portion 30*a*. The second portion 30*b* has a frame-like shape surrounding the first portion 30*a*.

As viewed in the lamination direction, an outer edge 31 of the second portion 30*b* includes a first side 31*a* and a second side 31*b*.

The first side 31*a* overlaps with the boundary line between the first portion 30*a* and the second portion 30*b*. The first side 31*a* is a linear line, for example. In the illustrated example, the first side 31*a* overlaps with the side of the first portion 30*a* in the −X-axis direction. The first side 31*a* is parallel to the Y-axis, for example.

The second side 31*b* faces the first side 31*a*. The second side 31*b* forms the outer edge of the lamination body 30. In the illustrated example, the second side 31*b* is a side of the second portion 30*b* in the −X-axis direction. The second side 31*b* is parallel to the first side 31*a*, for example.

A distance D between the first side 31*a* and the second side 31*b* is larger than a thickness T of the second semiconductor layer 36. The distance D is the shortest distance between the first side 31*a* and the second side 31*b*. The thickness T is the maximum thickness of the second semiconductor layer 36. The distance D is 500 nm, for example. The thickness T is from 10 nm to 10 nm, and may be 10 nm, for example. The size of the first semiconductor layer 32 in the X-axis direction is 3 μm, for example. The size of the third semiconductor layer 38 in the X-axis direction is 2 μm, for example. The thickness T and the distance D are measured by a Scanning Electron Microscope (SEM), for example.

1.3. Operations and Effects

In the light-emitting device 100, the lamination body 30 includes the first semiconductor layer 32 having the first conductivity type, the second semiconductor layer 36 having the second conductivity type different from the first conductivity type, the light-emitting layer 34 being provided between the first semiconductor layer 32 and the second semiconductor layer 36, and the third semiconductor layer 38 being provided on the opposite side of the second semiconductor layer 36 from the light-emitting layer 34 and having the second conductivity type. The electrical resistivity of the second semiconductor layer 36 is higher than the electrical resistivity of the third semiconductor layer 38. The first electrode 50 is electrically coupled to the first semiconductor layer 32, and the second electrode 60 is electrically coupled to the third semiconductor layer 38. As viewed in the lamination direction, the lamination body 30 includes the first portion 30*a* and the second portion 30*b* that is in contact with the first portion 30*a*. In the first portion 30*a*, the first semiconductor layer 32, the light-emitting layer 34, the second semiconductor layer 36, and the third semiconductor layer 38 overlap with each other. In the second portion 30*b*, the first semiconductor layer 32, the light-emitting layer 34, and the second semiconductor layer 36 overlap with each other, and the third semiconductor layer 38 does not overlap therewith.

Thus, in the light-emitting device 100, the second semiconductor layer 36 having high electrical resistivity can reduce the current flowing through the side surface of the light-emitting layer 34. With this, non-light-emission recombination on the side surface of the light-emitting layer 34 can be reduced.

Moreover, when the lamination body is formed by etching, the side surface of the lamination body is subjected to etching damage. Thus, at the side surface of the lamination body, a leak current is easily generated. In view of such as problem, in the light-emitting device 100, the second semiconductor layer 36 having high electrical resistivity can reduce the current flowing through the side surface of the second portion 30*b* of the lamination body 30. Thus, a leak current can be reduced.

In the light-emitting device 100, as viewed in the lamination direction, the outer edge 31 of the second portion 30*b* includes the first side 31*a* that overlaps with the boundary line between the first portion 30*a* and the second portion 30*b* and the second side 31*b* that faces the first side 31*a* and forms the outer edge of the lamination body 30. The distance D between the first side 31*a* and the second side 31*b* is larger than the thickness T of the second semiconductor layer 36. Thus, in the light-emitting device 100, the electrical resistivity of the second semiconductor layer 36 in the in-plane direction can be increased, as compared to a case in which the distance D is smaller than the thickness T, for example. With this, the current flowing through the side surface of the light-emitting layer 34 can further be reduced.

In the light-emitting device 100, the impurity concentration of the second semiconductor layer 36 is lower than the impurity concentration of the third semiconductor layer 38. Thus, in the light-emitting device 100, the electrical resistivity of the second semiconductor layer 36 can be higher than the electrical resistivity of the third semiconductor layer 38.

In the light-emitting device 100, the second semiconductor layer 36 is an AlGaN layer, and the third semiconductor layer 38 is a GaN layer. Thus, in the light-emitting device 100, the electrical resistivity of the second semiconductor layer 36 can be higher than the electrical resistivity of the third semiconductor layer 38, without causing the second semiconductor layer 36 and the third semiconductor layer 38 to have different impurity concentrations. When the impurity concentrations are the same, the AlGaN layer has electrical resistivity higher than a GaN layer. Further, when the lamination body 30 is epitaxially grown, and then the lamination body 30 is subjected to etching to form the second portion 30*b*, the second semiconductor layer 36 can be used as an etching stopper.

In the light-emitting device 100, the second portion 30*b* surrounds the first portion 30*a* as viewed in the lamination direction. Thus, in the light-emitting device 100, the current flowing through the side surface of the light-emitting layer 34 can further be reduced.

2. Manufacturing Method of Light-Emitting Device

Figure 4:
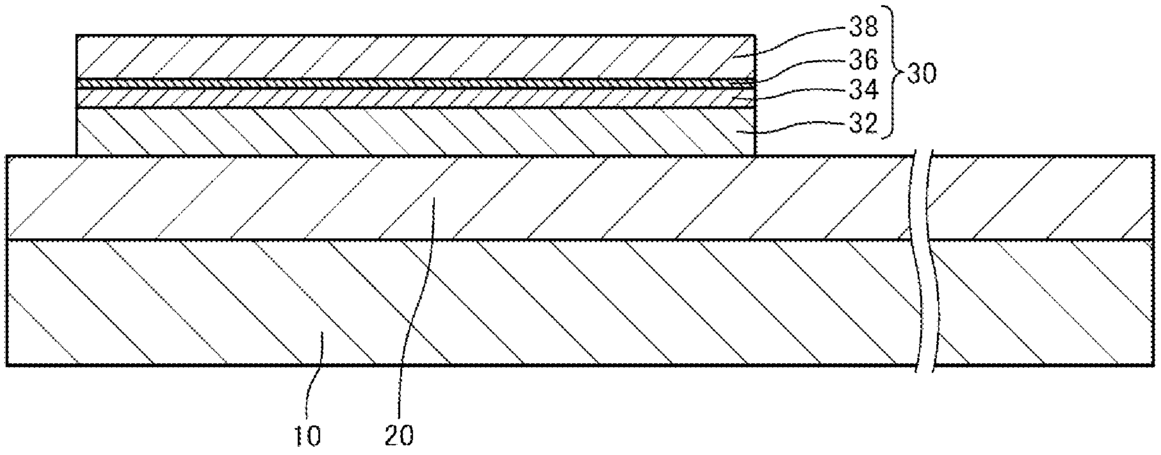
FIG. 4 is a cross-sectional view schematically illustrating a manufacturing process of the light-emitting device according to the present embodiment.
Figure 5:
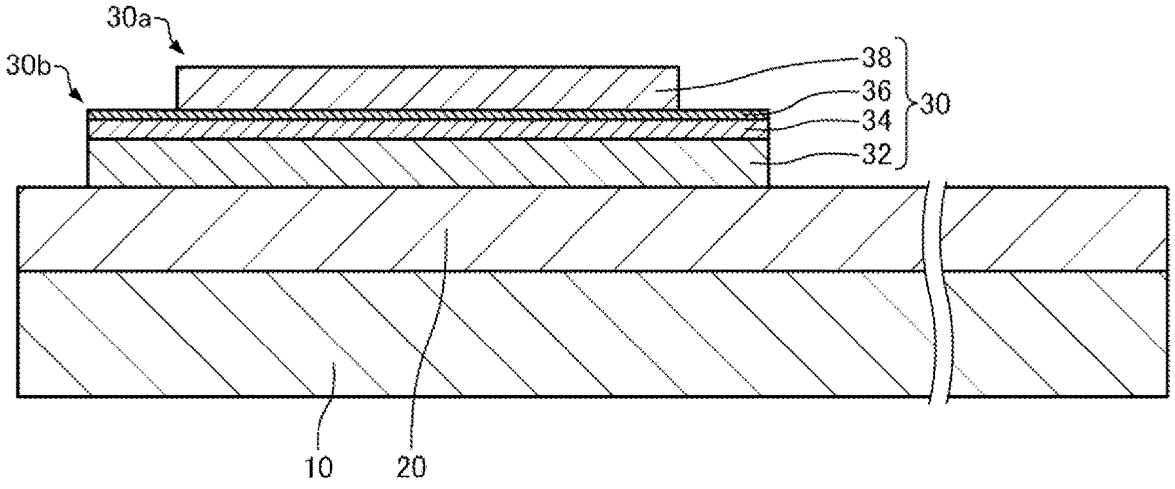
FIG. 5 is a cross-sectional view schematically illustrating a manufacturing process of the light-emitting device according to the present embodiment.

Next, a manufacturing method of the light-emitting device 100 according to the present embodiment is described with reference to the drawings. FIG. 4 and FIG. 5 are cross-sectional views schematically illustrating manufacturing processes of the light-emitting device 100 according to the present embodiment.

As illustrated in FIG. 4, the buffer layer 20 is epitaxially grown at the substrate 10. Examples of the epitaxial growth method include a Metal Organic Chemical Vapor Deposition (MOCVD) method and a Molecular Beam Epitaxy (MBE) method.

Subsequently, a mask layer omitted in illustration is formed at the buffer layer 20. The mask layer is formed by, for example, an electron beam vapor deposition method, a sputtering method, or the like.

Subsequently, the first semiconductor layer 32, the light-emitting layer 34, the second semiconductor layer 36, and the third semiconductor layer 38 are epitaxially grown in this order at the buffer layer 20, using the mask layer as a mask. Examples of the epitaxial growth method include an MOCVD method and an MBE method. Subsequently, the mask layer omitted in illustration is removed, for example. Note that the mask layer may be left without removal. By this process, the lamination body 30 is formed.

Note that the lamination body 30 may be formed by epitaxially growing the first semiconductor layer 32, the light-emitting layer 34, the second semiconductor layer 36, and the third semiconductor layer 38 subsequently to the buffer layer 20 without using a mask layer and subjecting the semiconductor layers 32, 36, and 38 and the light-emitting layer 34, which are grown, to patterning. Patterning is performed by photolithography and dry etching, for example.

As illustrated in FIG. 5, the third semiconductor layer 38 is subjected to patterning to form the first portion 30*a* and the second portion 30*b*. Patterning is performed by photolithography and dry etching, for example. When the second semiconductor layer 36 is an AlGaN layer, and the third semiconductor layer 38 is a GaN layer, the second semiconductor layer 36 may be used as an etching stopper. In this case, dry etching is performed by using such etching gas that an etching speed for the second semiconductor layer 36 is lower than an etching speed for the third semiconductor layer 38. By this process, the lamination body 30 including the first portion 30*a* and the second portion 30*b* is formed.

As illustrated in FIG. 1, the first conductive layer 62 is formed at the third semiconductor layer 38. The first conductive layer 62 is formed by, for example, a spattering method, a Chemical Vapor Deposition (CVD) method, or a vacuum deposition method.

Subsequently, the first electrode 50 is formed at the buffer layer 20. The first electrode 50 is formed by, for example, a spattering method, a CVD method, or a vacuum deposition method. Note that the order of the process of forming the first electrode 50 and the process of forming the first conductive layer 62 is not particularly limited.

Subsequently, the insulating layer 40 is formed at the buffer layer 20, the lamination body 30, and the first conductive layer 62. The insulating layer 40 is formed by a spin coating method or a CVD method, for example.

Subsequently, the insulating layer 40 is subjected to patterning to form the contact hole 42. The contact hole 42 is formed so that the first conductive layer 62 is exposed therefrom. Patterning is performed by photolithography and dry etching, for example.

Subsequently, the second conductive layer 64 is formed at the first conductive layer 62 and the insulating layer 40. Subsequently, the third conductive layer 66 is formed at the second conductive layer 64 and the insulating layer 40. The conductive layers 64 and 66 are formed by, for example, a spattering method, a CVD method, or a vacuum deposition method. By this process, the second electrode 60 is formed.

By the processes described above, the light-emitting device 100 can be manufactured.

3. Modification Examples of Light-Emitting Device

3.1. First Modification Example

Figure 6:
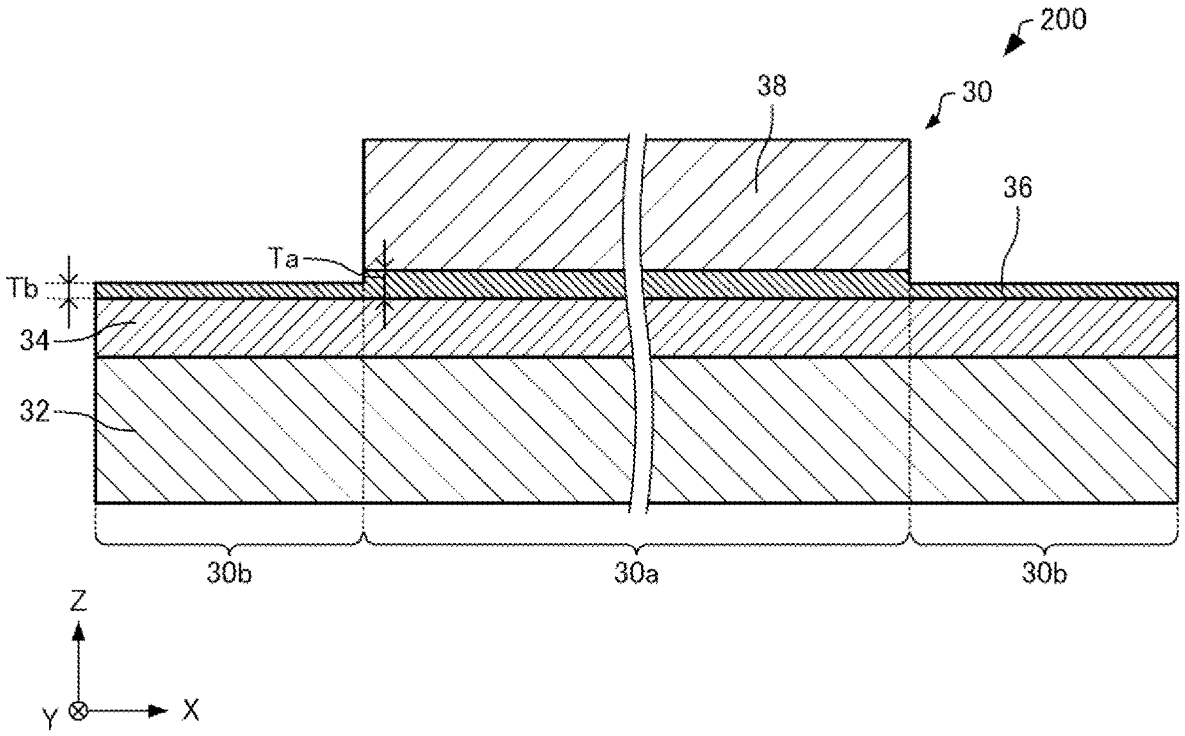
FIG. 6 is a cross-sectional view schematically illustrating a lamination body of a light-emitting device in a first modification of the present embodiment.

Next, a light-emitting device in a first modification example of the present embodiment is described with reference to the drawing. FIG. 6 is a cross-sectional view schematically illustrating the lamination body 30 of a light-emitting device 200 in the first modification of the present embodiment.

In the following description, in the light-emitting device 200 in the first modification example of the present embodiment, members having the same functions as the constituent members of the light-emitting device 100 according to the present embodiment described above are denoted by the same reference symbols, and detailed description thereof is omitted. The same applies to a light-emitting device in a second modification example of the present embodiment, which is described later.

As illustrated in FIG. 6, the light-emitting device 200 is different from the light-emitting device 100 described above in that a thickness Tb of the second semiconductor layer 36 in the second portion 30*b* is smaller than the thickness Ta of the second semiconductor layer 36 in the first portion 30*a*.

The thickness Ta is the maximum thickness of the second semiconductor layer 36 in the first portion 30*a*. The thickness Tb is the maximum thickness of the second semiconductor layer 36 in the second portion 30*b*. The thickness Tb is from 5 nm to 8 nm, for example. When the lamination body 30 is subjected to patterning to form the first portion 30*a* and the second portion 30*b*, an etching time is adjusted, for example. With this, the thickness Tb can be smaller than the thickness Ta.

In the light-emitting device 200, the thickness Tb of the second semiconductor layer 36 in the second portion 30*b* is smaller than the thickness Ta of the second semiconductor layer 36 in the first portion 30*a*. Thus, in the light-emitting device 200, the electrical resistivity of the second semiconductor layer 36 in the second portion 30*b* in the in-plane direction can be increased, as compared to a case in which the thickness Tb is the same as the thickness Ta, for example. With this, the current flowing through the side surface of the light-emitting layer 34 can further be reduced.

3.2. Second Modification Example

Figure 7:
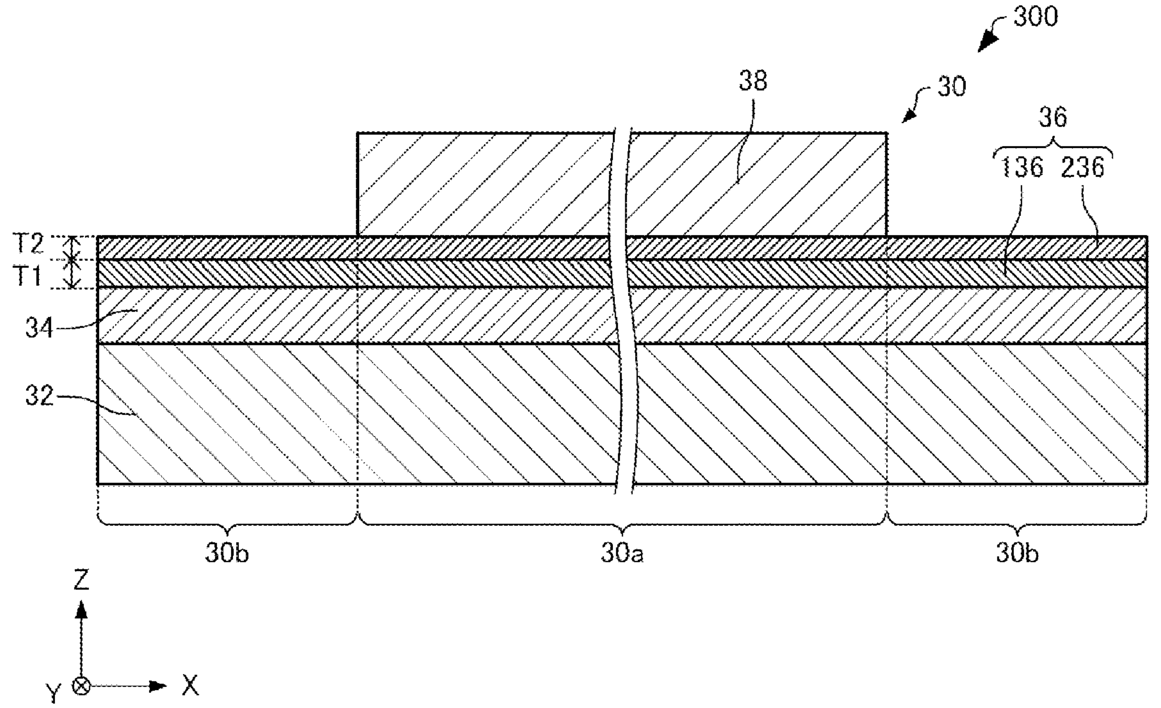
FIG. 7 is a cross-sectional view schematically illustrating a lamination body of a light-emitting device in a second modification of the present embodiment.

Next, a light-emitting device in a second modification example of the present embodiment is described with reference to the drawings. FIG. 7 is a cross-sectional view schematically illustrating the lamination body 30 of a light-emitting device 300 in the second modification of the present embodiment.

As illustrated in FIG. 7, the light-emitting device 300 is different from the light-emitting device 100 described above in that the second semiconductor layer 36 includes a first layer 136 and a second layer 236.

The first layer 136 is provided at the light-emitting layer 34. The first layer 136 is provided between the light-emitting layer 34 and the second layer 236. The first layer 136 is a layer on the light-emitting layer 34 side. The first layer 136 is in contact with the light-emitting layer 34. The electrical resistivity of the first layer 136 is higher than the electrical resistivity of the third semiconductor layer 38. The first layer 136 is a p-type AlGaN layer, for example.

The second layer 236 is provided at the first layer 136. The second layer 236 is provided between the first layer 136 and the third semiconductor layer 38. The second layer 236 is a layer on the third semiconductor layer 38 side. The second layer 236 is in contact with the third semiconductor layer 38. For example, a thickness T2 of the second layer 236 is smaller than a thickness T1 of the first layer 136, for example. The thickness T1 is the maximum thickness of the first layer 136. The thickness T2 is the maximum thickness of the second layer 236. Note that, although not illustrated, the thickness T2 may be the same as the thickness T1, or may be larger than the thickness T1.

The electrical resistivity of the second layer 236 is higher than the electrical resistivity of the third semiconductor layer 38, and is lower than the electrical resistivity of the first layer 136. The second layer 236 is a p-type GaN layer, for example. The impurity concentration of the second layer 236 is higher than the impurity concentration of the first layer 136, for example.

In the light-emitting device 300, the second semiconductor layer 36 includes the first layer 136 that is in contact with the light-emitting layer 34 and the second layer 236 that is in contact with the third semiconductor layer 38, and the electrical resistivity of the second layer 236 is lower than the electrical resistivity of the first layer 136. Thus, in the light-emitting device 300, contact resistance between the second semiconductor layer 36 and the third semiconductor layer 38 can be reduced more than that in a case in which the electrical resistivity of the second layer is the same as the electrical resistivity of the first layer, for example.

In the light-emitting device 300, the thickness T2 of the second layer 236 is smaller than the thickness T1 of the first layer 136. Thus, in the light-emitting device 300, the electrical resistivity of the second layer 236 in the in-plane direction can be increased, as compared to a case in which T2 is the same as T1, for example. With this, the current flowing through the side surface of the light-emitting layer 34 can further be reduced.

Figure 8:
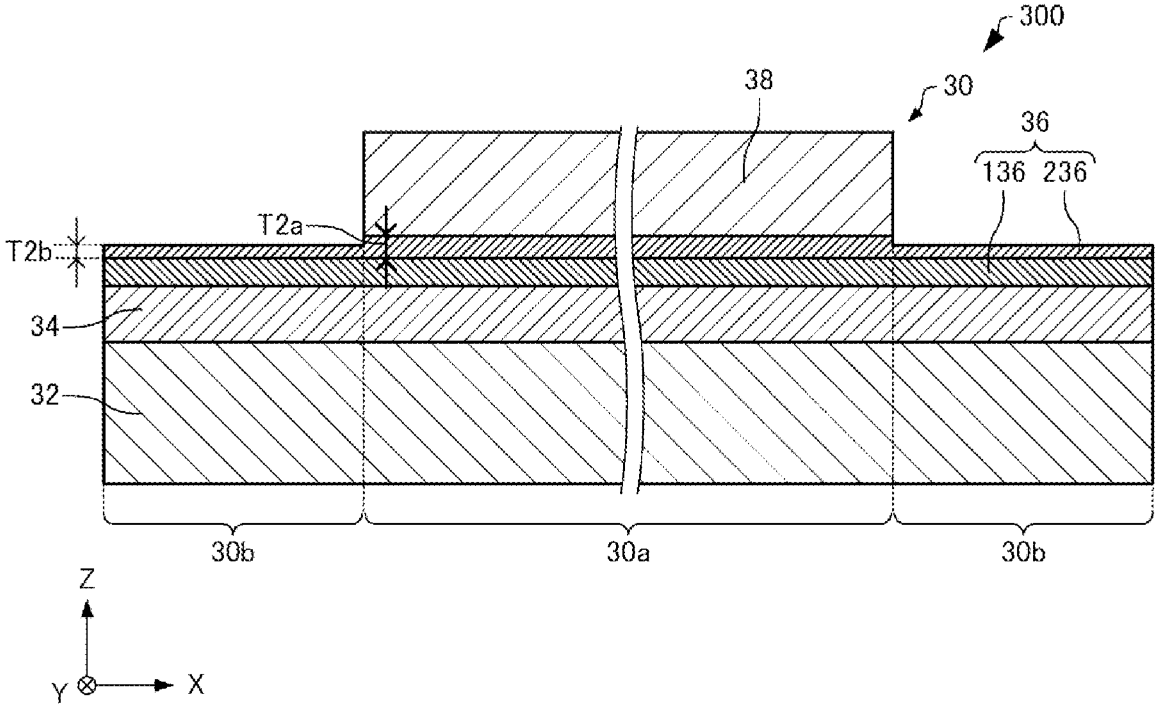
FIG. 8 is a cross-sectional view schematically illustrating the lamination body of the light-emitting device in the second modification of the present embodiment.

Note that, as illustrated in FIG. 8, the thickness T2*b* of the second layer 236 in the second portion 30*b* may be smaller than the thickness T2*a* of the second layer 236 in the first portion 30*a*. The thickness T2*a* is the maximum thickness of the second layer 236 in the first portion 30*a*. The thickness T2*b* is the maximum thickness of the second layer 236 in the second portion 30*b*. When the thickness T2*b* is smaller than the thickness T2*a*, the electrical resistivity of the second layer 236 in the second portion 30*b* in the in-plane direction can be increased, as compared to a case in which the thickness T2*b* is the same as the thickness T2*a*. With this, the current flowing through the side surface of the light-emitting layer 34 can further be reduced.

Further, although not illustrated, the second portion 30*b* may not include the second layer 236. In other words, only the first portion 30*a* may include the second layer 236. Further, although not illustrated, the second semiconductor layer 36 may include a plurality of, specifically, three or more layers.

4. Projector

Figure 9:
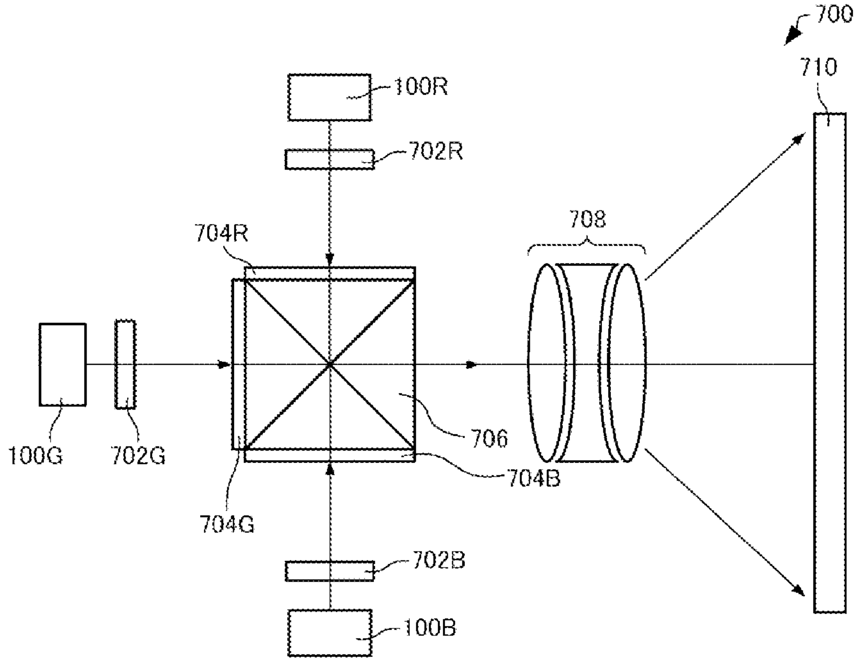
FIG. 9 is a diagram schematically illustrating a projector according to the present embodiment.

Next, a projector as a display device according to the present embodiment is described with reference to the drawing. FIG. 9 is a diagram schematically illustrating a projector 700 according to the present embodiment.

The projector 700 includes the light-emitting device 100 as a light source, for example.

The projector 700 includes a housing omitted in illustration, and a red light source 100R, a green light source 100G, and a blue light source 100B that are provided in the housing and emit red light, green light, and blue light, respectively. Note that, for the sake of convenience, in FIG. 9, the red light source 100R, the green light source 100G, and the blue light source 100B are illustrated in a simplified manner.

The projector 700 further includes a first optical element 702R, a second optical element 702G, a third optical element 702B, a first optical modulation device 704R, a second optical modulation device 704G, a third optical modulation device 704B, and a projection device 708, which are provided in the housing, for example. The first optical modulation device 704R, the second optical modulation device 704G, and the third optical modulation device 704B are transmissive liquid crystal light valves, for example. The projection device 708 is a projection lens, for example.

The light emitted from the red light source 100R is incident on the first optical element 702R. The light emitted from the red light source 100R is condensed by the first optical element 702R. Note that the first optical element 702R may have a function other than the condensing. The second optical element 702G and the third optical element 702B may also have a function other than the condensing.

The light condensed by the first optical element 702R is incident on the first optical modulation device 704R. The first optical modulation device 704R modulates the incident light, based on image information. Then, the projection device 708 enlarges the image formed by the first optical modulation device 704R, and projects the image on a screen 710.

The light emitted from the green light source 100G is incident on the second optical element 702G. The light emitted from the green light source 100G is condensed by the second optical element 702G.

The light condensed by the second optical element 702G is incident on the second optical modulation device 704G. The second optical modulation device 704G modulates the incident light, based on the image information. Then, the projection device 708 enlarges the image formed by the second optical modulation device 704G, and projects the image on the screen 710.

The light emitted from the blue light source 100B is incident on the third optical element 702B. The light emitted from the blue light source 100B is condensed by the third optical element 702B.

The light condensed by the third optical element 702B is incident on the third optical modulation device 704B. The third optical modulation device 704B modulates the incident light, based on the image information. Then, the projection device 708 enlarges the image formed by the third optical modulation device 704B, and projects the image on the screen 710.

The projector 700 further includes a cross dichroic prism 706 that synthesizes the light emitted from the first optical modulation device 704R, the light emitted from the second optical modulation device 704G, and the light emitted from the third optical modulation device 704B and guides the resultant light to the projection device 708, for example.

Light of three colors modulated by the first optical modulation device 704R, the second optical modulation device 704G, and the third optical modulation device 704B is incident on the cross dichroic prism 706. In the cross dichroic prism 706, four right-angle prisms are bonded together, and a dielectric multilayer film configured to reflect the red light and a dielectric multilayer film configured to reflect the blue light are provided to inner surfaces of the prisms. These dielectric multilayer films combine the three color lights to form light representing a color image. The synthesized light is projected onto the screen 710 by the projection device 708, and an image is enlarged to be displayed.

Note that, with the light-emitting devices 100 of the red light source 100R, the green light source 100G, and the blue light source 100B controlled as pixels of an image based on the image information, the image may be directly formed without using the first optical modulation device 704R, the second optical modulation device 704G, and the third optical modulation device 704B. The projection device 708 may enlarge the image formed by the red light source 100R, the green light source 100G, and the blue light source 100B and project the enlarged image on the screen 710.

Although the transmissive liquid crystal light valve is used as the optical modulation device in the above example, a light valve other than the liquid crystal light valve may be used, or a reflective light valve may be used. Examples of such a light valve include a reflective liquid crystal light valve and a digital micro mirror device. A configuration of the projection device is appropriately changed depending on a type of the light valve to be used.

Further, the light source can also be applied to a light source device of a scanning type image display device including a scanning unit which is an image forming device for displaying an image of a desired size on a display surface by scanning a screen with light from the light source.

5. Display

Figure 10:
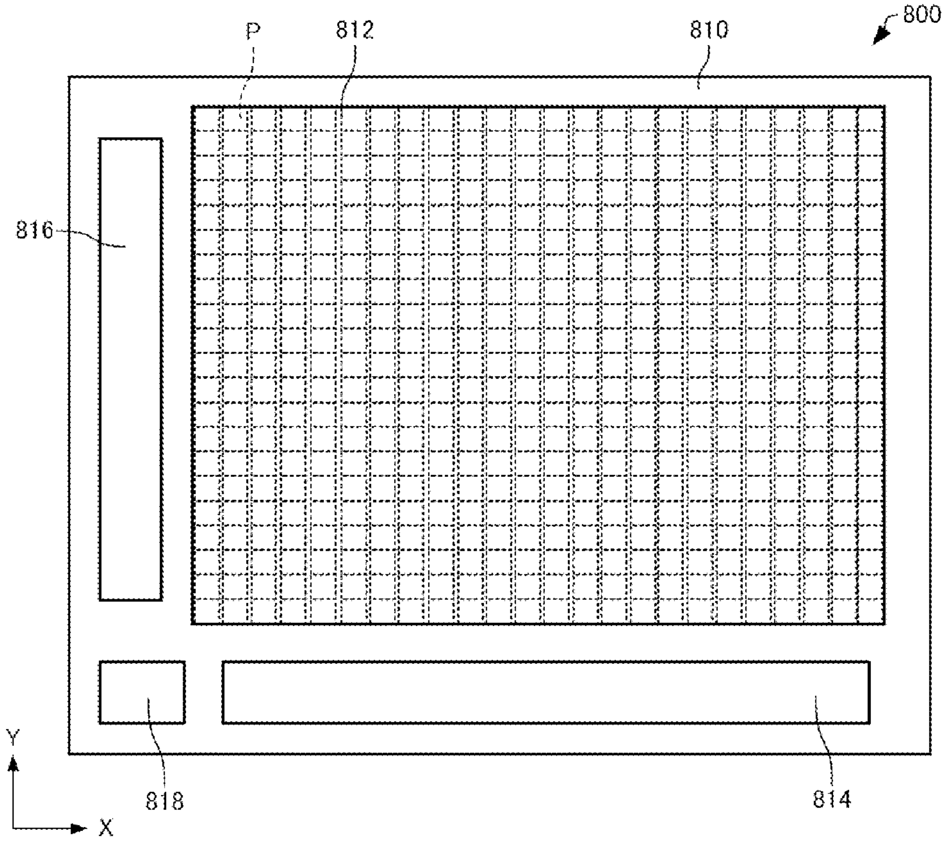
FIG. 10 is a plan view schematically illustrating a display according to the present embodiment.
Figure 11:
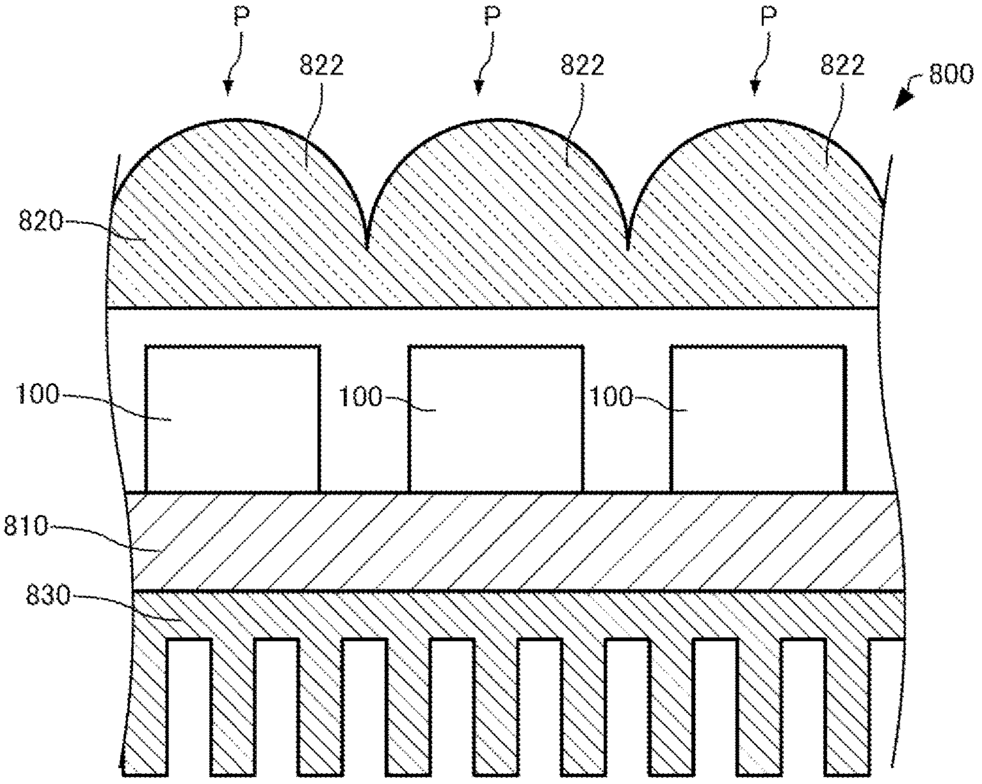
FIG. 11 is a cross-sectional view schematically illustrating the display according to the present embodiment.

Next, a display as the display device according to the present embodiment is described with reference to the drawing. FIG. 10 is a plan view schematically illustrating a display 800 according to the present embodiment. FIG. 11 is a cross-sectional view schematically illustrating the display 800 according to the present embodiment. Note that, in FIG. 10, an X-axis and a Y-axis are illustrated as two axes orthogonal to each other.

The display 800 includes the light-emitting device 100 as a light source, for example.

The display 800 is a display device that displays an image. The image includes those only displaying character information. The display 800 is a self-luminous display. As illustrated in FIG. 10 and FIG. 11, the display 800 includes a circuit board 810, a lens array 820, and a heat sink 830, for example.

A drive circuit for driving the light-emitting device 100 is mounted on the circuit board 810. The drive circuit is a circuit including a Complementary Metal Oxide Semiconductor (CMOS) and the like for example. The drive circuit drives the light-emitting device 100 based on, for example, input image information. Although not illustrated, a translucent substrate for protecting the circuit board 810 is arranged at the circuit board 810.

The circuit board 810 includes a display region 812, a data line driving circuit 814, a scanning line driving circuit 816, and a control circuit 818, for example.

The display region 812 includes a plurality of pixels P. In the illustrated example, the pixels P are arranged along the X-axis and the Y-axis.

Although not illustrated, the circuit board 810 is provided with a plurality of scanning lines and a plurality of data lines. For example, the scanning lines extend along the X-axis, and the data lines extend along the Y-axis. The scanning lines are coupled to the scanning line driving circuit 816. The data lines are coupled to the data line driving circuit 814. In addition, the pixels P are provided to correspond to intersections between the plurality of scanning lines and the plurality of data lines.

The pixels P each includes one light-emitting device 100, one lens 822, and a pixel circuit omitted in illustration, for example. The pixel circuit includes a switching transistor that functions as a switch for the pixel P. The switching transistor has the gate coupled to the scanning line, and has one of the source and the drain coupled to the data line.

The data line driving circuit 814 and the scanning line driving circuit 816 are circuits that control driving of the light-emitting device 100 forming the pixel P. The control circuit 818 controls display of an image.

Image data is supplied to the control circuit 818 from an upper level circuit. The control circuit 818 supplies various signals based on the image data to the data line driving circuit 814 and the scanning line driving circuit 816.

When the scanning line is selected by activating the scanning signal by the scanning line driving circuit 816, the switching transistor provided in the selected pixel P is turned on. At this time, the data line driving circuit 814 supplies a data signal from the data line to the selected pixel P. As a result, the light-emitting device 100 of the selected pixel P emits light based on the data signal.

The lens array 820 includes a plurality of the lenses 822. For example, one lens 822 is provided for one light-emitting device 100. Light emitted from light-emitting device 100 is incident on one lens 822.

The heat sink 830 is in contact with the circuit board 810. The material of the heat sink 830 is metal such as copper and aluminum. The heat sink 830 dissipates heat generated by the light-emitting device 100.

6. Head-Mounted Display

6.1. Overall Configuration

Figure 12:
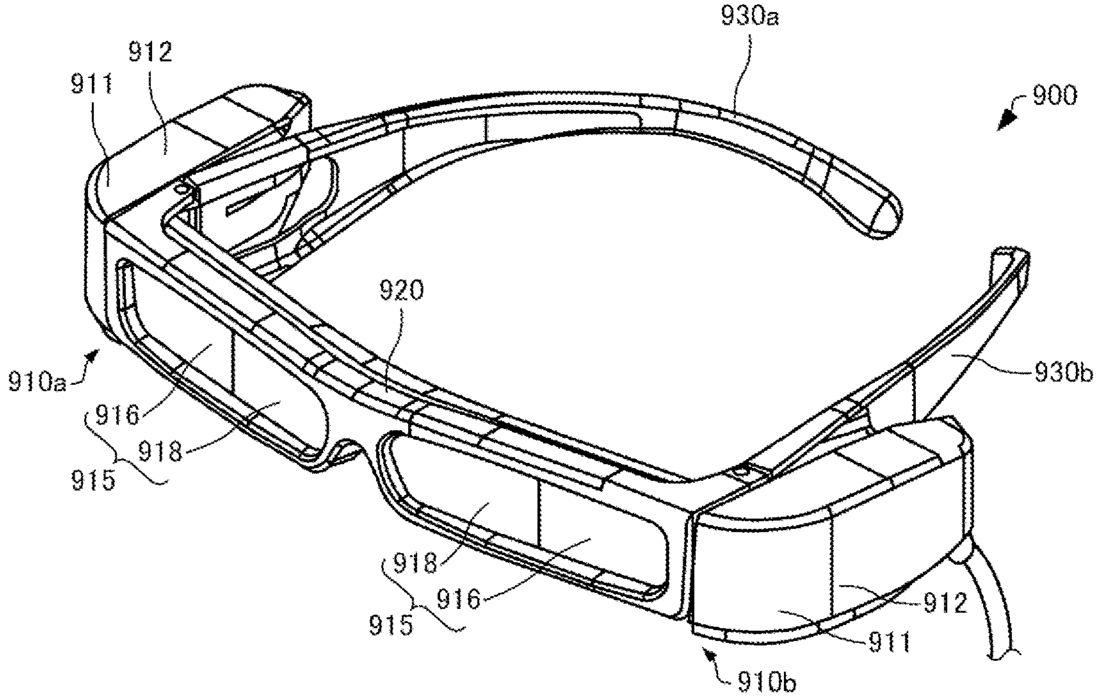
FIG. 12 is a perspective view schematically illustrating a head-mounted display according to the present embodiment.

Next, a head-mounted display as the electronic apparatus according to the present embodiment is described with reference to the drawing. FIG. 12 is a perspective view schematically illustrating a head-mounted display 900 according to the present embodiment.

As illustrated in FIG. 12, the head-mounted display 900 is a head-mounted device that has an outer appearance of an eyewear. The head-mounted display 900 is mounted on a head of a viewer. The viewer is a user who uses the head-mounted display 900. The head-mounted display 900 allows the viewer to visually recognize image light of a virtual image and to visually recognize an external image in a see-through manner.

The head-mounted display 900 includes a first display unit 910*a*, a second display unit 910*b*, a frame 920, a first temple 930*a*, and a second temple 930*b*, for example.

The first display unit 910*a* and the second display unit 910*b* display images. Specifically, the first display unit 910*a* displays a virtual image for the right eye of the viewer. The second display unit 910*b* displays a virtual image for the left eye of the viewer. The display units 910*a* and 910*b* include, for example, an image forming device 911 and a light-guiding device 915.

The image forming device 911 generates image light. The image forming device 911 includes an optical system such as a light source and a projection device, and an external member 912, for example. The external member 912 houses the light source and the projection device.

The light-guiding device 915 covers the front of the eyes of the viewer. The light-guiding device 915 guides the image light formed by the image forming device 911, and allows the viewer to visually recognize external light and the image light in an overlapping manner. Note that details of the image forming device 911 and the light-guiding device 915 are described later.

The frame 920 supports the first display unit 910*a* and the second display unit 910*b*. For example, the frame 920 surrounds the display units 910*a* and 910*b*. In the illustrated example, the image forming device 911 of the first display unit 910*a* is attached to one end portion of the frame 920. The image forming device 911 of the second display unit 910*b* is attached to the other end portion of the frame 920.

The first temple 930*a* and the second temple 930*b* extend from the frame 920. In the illustrated example, the first temple 930*a* extends from one end portion of the frame 920. The second temple 930*b* extends from the other end portion of the frame 920.

The first temple 930*a* and the second temple 930*b* are put on the ears of the viewer when the head-mounted display 900 is worn by the viewer. The head of the viewer is positioned between the temples 930*a* and 930*b*.

6.2. Image Forming Device and Light-Guiding Device

Figure 13:
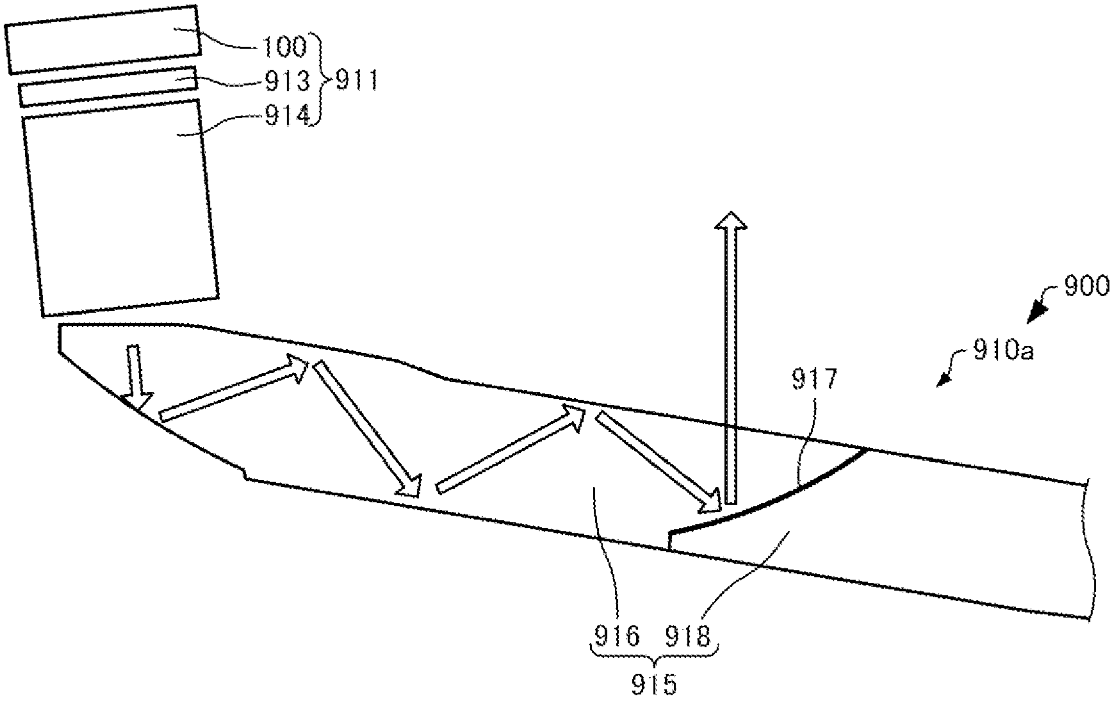
FIG. 13 is a diagram schematically illustrating an image forming device and a light-guiding device of the head-mounted display according to the present embodiment.

FIG. 13 is a diagram schematically illustrating the image forming device 911 and the light-guiding device 915 of the first display unit 910*a* of the head-mounted display 900. Note that the first display unit 910*a* and the second display unit 910*b* have basically the same configuration. Therefore, the following description on the first display unit 910*a* is applied to the second display unit 910*b*.

As illustrated in FIG. 13, the image forming device 911 includes the light-emitting device 100 as a light source, an optical modulation device 913, and a projection device 914 for image formation, for example.

The optical modulation device 913 modulates the light incident from the light-emitting device 100 based on image information, and emits image light. The optical modulation device 913 is a transmissive liquid crystal light valve. Note that the light-emitting device 100 may be a self-luminous light-emitting device that emits light based on the image information input. In this case, the optical modulation device 913 is not provided.

The projection device 914 projects the image light emitted from the optical modulation device 913 toward the light-guiding device 915. The projection device 914 is a projection lens, for example. As the lens forming the projection device 914, a lens having an axially symmetric surface as a lens surface may be used.

The light-guiding device 915 is accurately positioned with respect to the projection device 914 by being screwed to a lens barrel of the projection device 914, for example. The light-guiding device 915 includes an image light-guiding member 916 that guides the image light and a see-through member 918 for see-through view, for example.

The image light emitted from the projection device 914 is incident on the image light-guiding member 916. The image light-guiding member 916 is a prism that guides the image light toward the eyes of the viewer. The image light incident on the image light-guiding member 916 is repeatedly reflected on the inner surface of the image light guide member 916, and then is reflected by a reflective layer 917 to be emitted from the image light-guiding member 916. The image light emitted from the image light-guiding member 916 reaches the eyes of the viewer. The reflective layer 917 is constituted by, for example, metal or a dielectric multi-layer film. The reflective layer 917 may be a half mirror.

The see-through member 918 is adjacent to the image light-guiding member 916. The see-through member 918 is fixed to the image light-guiding member 916. The outer surface of the see-through member 918 is continuous with the outer surface of the image light-guiding member 916, for example. The viewer sees the external light through the see-through member 918. The image light-guiding member 916 also has the function of making the viewer see the external light therethrough, in addition to the function of guiding the image light. Note that the head-mounted display 900 may be configured so as not to allow the viewer to see the external light therethrough.

The light-emitting device according to the embodiment described above can be used for devices other than the projector, the display, and the head-mounted display. The light-emitting device according to the embodiment described above is used for, for example, indoor/outdoor lighting, a laser printer, a scanner, a sensing apparatus using light, an Electronic View Finder (EVF), a wearable display such as a smart watch, an on-board light, or an on-board head-up display.

The embodiment and the modification examples described above are examples, and are not intended as limitations. For example, each embodiment and each modification example can also be combined as appropriate.

The present disclosure includes configurations that are substantially identical to the configurations described in the embodiment, for example, configurations with identical functions, methods, and results, or with identical advantages and effects. Also, the present disclosure includes configurations obtained by replacing non-essential portions of the configurations described in the embodiment. In addition, the present disclosure includes configurations having the same operations and effects or can achieve the same advantages as those of the configurations described in the embodiment. Further, the present disclosure includes configurations obtained by adding known techniques to the configurations described in the embodiment.

The following content is derived from the embodiment and the modification examples described above.

A light-emitting device according to one aspect includes a lamination body, and a first electrode and a second electrode, wherein the lamination body includes a first semiconductor layer having a first conductivity type, a second semiconductor layer having a second conductivity type different from the first conductivity type, a light-emitting layer being provided between the first semiconductor layer and the second semiconductor layer, and a third semiconductor layer being provided on an opposite side of the second semiconductor layer from the light-emitting layer and having the second conductivity type, electrical resistivity of the second semiconductor layer is higher than electrical resistivity of the third semiconductor layer, the first electrode is electrically coupled to the first semiconductor layer, the second electrode is electrically coupled to the third semiconductor layer, the lamination body includes a first portion and a second portion being in contact with the first portion as viewed in a lamination direction of the first semiconductor layer and the light-emitting layer, in the first portion, the first semiconductor layer, the light-emitting layer, the second semiconductor layer, and the third semiconductor layer overlap with each other, and, in the second portion, the first semiconductor layer, the light-emitting layer, and the second semiconductor layer overlap with each other, and the third semiconductor layer does not overlap therewith.

According to the light-emitting device, the current flowing through the side surface of the light-emitting layer can be reduced. With this, non-light-emission recombination on the side surface of the light-emitting layer can be reduced.

In the light-emitting device according to the aspect, a thickness of the second semiconductor layer in the second portion may be smaller than a thickness of the second semiconductor layer in the first portion.

According to the light-emitting device, the current flowing through the side surface of the light-emitting layer can further be reduced.

In the light-emitting device according to the aspect, the second semiconductor layer may include a first layer being in contact with the light-emitting layer and a second layer being in contact with the third semiconductor layer, and electrical resistivity of the second layer may be lower than electrical resistivity of the first layer.

According to the light-emitting device, contact resistance between the second semiconductor layer and the third semiconductor layer can be reduced.

In the light-emitting device according to the aspect, a thickness of the second layer may be smaller than a thickness of the first layer.

According to the light-emitting device, the current flowing through the side surface of the light-emitting layer can further be reduced.

In the light-emitting device according to the aspect, a thickness of the second layer in the second portion may be smaller than a thickness of the second layer in the first portion.

According to the light-emitting device, the current flowing through the side surface of the light-emitting layer can further be reduced.

In the light-emitting device according to the aspect, as viewed in the lamination direction, an outer edge of the second portion may include a first side overlapping with a boundary line between the first portion and the second portion and a second side facing the first side and forming an outer edge of the lamination body, and a distance between the first side and the second side may be larger than a thickness of the second semiconductor layer.

According to the light-emitting device, the current flowing through the side surface of the light-emitting layer can further be reduced.

In the light-emitting device according to the aspect, an impurity concentration of the second semiconductor layer may be lower than an impurity concentration of the third semiconductor layer.

According to the light-emitting device, the electrical resistivity of the second semiconductor layer can be higher than the electrical resistivity of the third semiconductor layer.

In the light-emitting device according to the aspect, the second semiconductor layer may be an AlGan layer, and the third semiconductor layer may be a GaN layer.

According to the light-emitting device, the electrical resistivity of the second semiconductor layer can be higher than the electrical resistivity of the third semiconductor layer, without causing the second semiconductor layer and the third semiconductor layer to have different impurity concentrations.

In the light-emitting device according to the aspect, the second portion may surround the first portion as viewed in the lamination direction.

According to the light-emitting device, the current flowing through the side surface of the light-emitting layer can further be reduced.

A display device according to one aspect includes the light-emitting device according to the aspect.

An electronic apparatus according to one aspect includes the light-emitting device according to the aspect.

What is claimed is:

1. A light-emitting device comprising:

a lamination body; and a first electrode and a second electrode, wherein the lamination body includes:

a first semiconductor layer having a first conductivity type;

a second semiconductor layer having a second conductivity type different from the first conductivity type;

a light-emitting layer being provided between the first semiconductor layer and the second semiconductor layer; and a third semiconductor layer being provided on an opposite side of the second semiconductor layer from the light-emitting layer and having the second conductivity type, electrical resistivity of the second semiconductor layer is higher than electrical resistivity of the third semiconductor layer, the first electrode is electrically coupled to the first semiconductor layer, the second electrode is electrically coupled to the third semiconductor layer, the lamination body includes a first portion and a second portion being in contact with the first portion as viewed in a lamination direction of the first semiconductor layer and the light-emitting layer, in the first portion, the first semiconductor layer, the light-emitting layer, the second semiconductor layer, and the third semiconductor layer overlap with each other, and in the second portion, the first semiconductor layer, the light-emitting layer, and the second semiconductor layer overlap with each other, and the third semiconductor layer does not overlap therewith.

2. The light-emitting device according to claim 1, wherein a thickness of the second semiconductor layer in the second portion is smaller than a thickness of the second semiconductor layer in the first portion.

3. The light-emitting device according to claim 1, wherein the second semiconductor layer includes:

a first layer being in contact with the light-emitting layer; and a second layer being in contact with the third semiconductor layer, and electrical resistivity of the second layer is lower than electrical resistivity of the first layer.

4. The light-emitting device according to claim 3, wherein a thickness of the second layer is smaller than a thickness of the first layer.

5. The light-emitting device according to claim 3, wherein a thickness of the second layer in the second portion is smaller than a thickness of the second layer in the first portion.

6. The light-emitting device according to claim 1, wherein as viewed in the lamination direction, an outer edge of the second portion includes:

a first side overlapping with a boundary line between the first portion and the second portion; and a second side facing the first side and forming an outer edge of the lamination body, and a distance between the first side and the second side is larger than a thickness of the second semiconductor layer.

7. The light-emitting device according to claim 1, wherein an impurity concentration of the second semiconductor layer is lower than an impurity concentration of the third semiconductor layer.

8. The light-emitting device according to claim 1, wherein the second semiconductor layer is an AlGan layer, and the third semiconductor layer is a GaN layer.

9. The light-emitting device according to claim 1, wherein the second portion surrounds the first portion as viewed in the lamination direction.

10. A display device comprising the light-emitting device according to claim 1.

11. An electronic apparatus comprising the light-emitting device according to claim 1.

* * * * *